US009029972B2

(12) United States Patent
Nagaraja

(10) Patent No.: US 9,029,972 B2
(45) Date of Patent: May 12, 2015

(54) IMAGE SENSORS WITH IN-PIXEL ANTI-BLOOMING DRAINS

(71) Applicant: Semiconductor Components Industries, LLC, Phoenix, AZ (US)

(72) Inventor: Satyadev Nagaraja, San Jose, CA (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 14/033,881

(22) Filed: Sep. 23, 2013

(65) Prior Publication Data

US 2014/0084409 A1 Mar. 27, 2014

Related U.S. Application Data

(60) Provisional application No. 61/705,593, filed on Sep. 25, 2012.

(51) Int. Cl.
*H01L 27/146* (2006.01)

(52) U.S. Cl.
CPC .... *H01L 27/14654* (2013.01); *H01L 27/14607* (2013.01)

(58) Field of Classification Search
CPC .......... H01L 27/24887; H01L 27/14654; H01L 65/40; H01L 27/14607
USPC .......................................................... 257/223
See application file for complete search history.

(56) References Cited

U.S. PATENT DOCUMENTS

| 4,916,501 | A | * | 4/1990 | Thenoz et al. | 257/223 |
|---|---|---|---|---|---|
| 5,619,049 | A | * | 4/1997 | Kim | 257/223 |
| 5,898,195 | A | * | 4/1999 | Harada | 257/223 |
| 5,942,774 | A | * | 8/1999 | Isogai et al. | 257/292 |
| 6,465,859 | B1 | * | 10/2002 | Fujiwara et al. | 257/435 |
| 6,599,772 | B2 | * | 7/2003 | Abe | 438/78 |
| 7,545,423 | B2 | * | 6/2009 | Park et al. | 348/294 |
| 7,902,624 | B2 | * | 3/2011 | Rhodes et al. | 257/446 |
| 8,575,531 | B2 | | 11/2013 | Hynecek et al. | |
| 2006/0255372 | A1 | | 11/2006 | Patrick et al. | |
| 2012/0235212 | A1 | | 9/2012 | Chen et al. | |

* cited by examiner

*Primary Examiner* — William D Coleman
(74) *Attorney, Agent, or Firm* — Treyz Law Group; Kendall P. Woodruff

(57) ABSTRACT

An imaging system may include an image sensor having an array of image pixels formed in a substrate. Each image pixel may include a photodiode directly coupled to an anti-blooming diode. The anti-blooming diode may be connected to a positive voltage supply line and may be configured to drain excess charge from the photodiode when the photodiode is saturated. The anti-blooming drain may be formed from an n-type diffusion region partially surrounded by a p-type doped layer. The p-type doped layer may be interposed between and in contact with the n-type diffusion region of the anti-blooming diode and an n-type doped region of the photodiode. The anti-blooming diode may begin to drain excess charge from the photodiode in response to the photodiode reaching a threshold potential during integration. If desired, multiple pixels may share a common anti-blooming diode.

19 Claims, 4 Drawing Sheets

IMAGE SENSORS WITH IN-PIXEL ANTI-BLOOMING DRAINS

This application claims the benefit of provisional patent application No. 61/705,593, filed Sep. 25, 2012, which is hereby incorporated by reference herein in its entirety.

BACKGROUND

This relates generally to imaging systems and, more particularly, to imaging systems with in-pixel anti-blooming diodes.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

In conventional image sensors, over of a photosensor to light can cause charge from a saturated pixel to "bloom" into neighboring non-saturated pixels, which in turn can cause the neighboring pixels to exhibit a non-linear response to light. To avoid undesirable image artifacts that can result from blooming charge, conventional image sensors sometimes hold a floating diffusion region at a reference potential during integration so that excess charge flows into the floating diffusion region and away from adjacent photodiodes. However, this type of configuration often leads to increased dark current generated under the transfer gate due to the voltage that is necessary to allow charge to flow from the photodiode to the floating diffusion region.

It would therefore be desirable to be able to provide image sensors with improved anti-blooming circuitry and minimized dark current.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photodiodes.

One or more image pixels in a pixel array may include an anti-blooming drain for collecting excess charge when the photodiode is filled to capacity. The anti-blooming drain may, for example, be an anti-blooming diode formed in the image sensor substrate adjacent to the photodiode and may be directly coupled to the photodiode. The anti-blooming diode may be used to help prevent blooming charge from overflowing into a neighboring non-saturated photodiode without increasing dark current or reducing the full well capacity of the photodiode.

Figure 1:
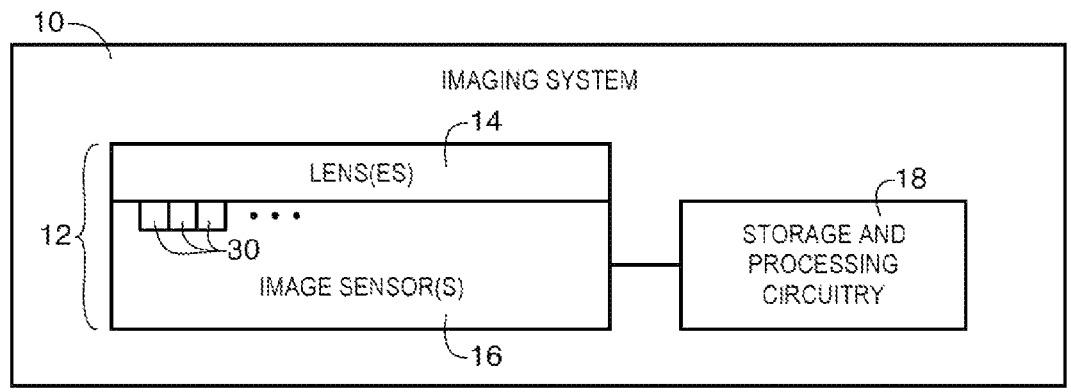
FIG. 1 is a diagram of an illustrative imaging system that may include an image sensor having image pixels with in-pixel anti-blooming diodes in accordance with an embodiment of the present invention.

FIG. 1 is a diagram of an illustrative imaging system that uses image pixels with in-pixel anti-blooming drains such as anti-blooming diodes. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor integrated circuit the with an array of image pixels 30. Image pixels 30 may each include an anti-blooming diode for collecting excess charge when the pixel is saturated.

During image capture operations, lens 14 may focus light from a scene onto an image pixel array in image sensor 16. Image sensor 16 may provide corresponding digital image data to control circuitry such as storage and processing circuitry 18.

Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Figure 2:
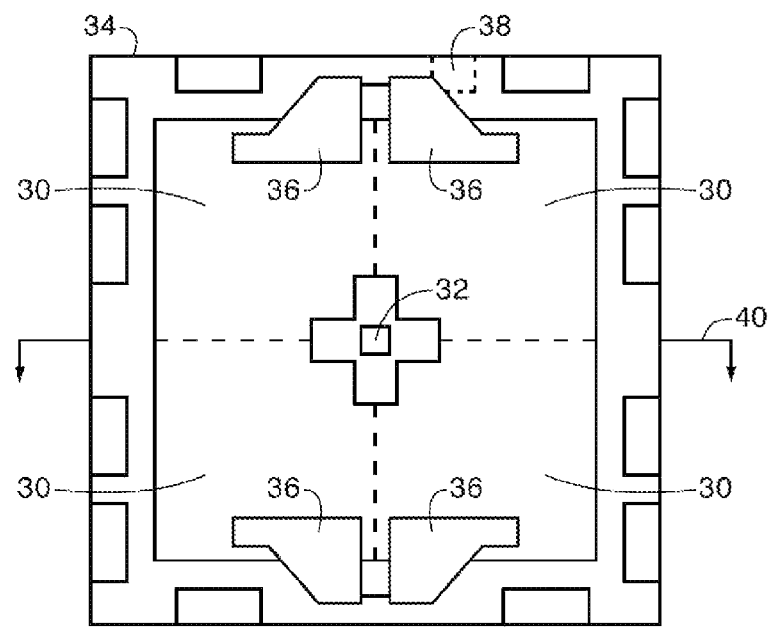
FIG. 2 is a top view of a portion of an illustrate image pixel array having image pixels that include an anti-blooming diodes in accordance with an embodiment of the present invention.

FIG. 2 is a top view of illustrative image pixels 30 that may be used in an image sensor such as image sensor 16 of FIG. 1. As shown in FIG. 2, image sensor pixels 30 may be fabricated on as substrate such as substrate 34 (e.g., as silicon substrate or other suitable image sensor substrate). Substrate 34 may have a top (front) surface and a bottom (back) surface. Image sensing circuitry such as transistors and interconnect structures may be formed on a surface of substrate 34 (e.g., a front side surface).

If desired, color filter elements may be formed over some or all of image pixels 30. Color filter elements may, for example, include red color filter elements, (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and or absorbing other colors of light), clear color filter elements (e.g., transparent material that passes red, blue, and green light) or other color filter elements. If desired, some or all of image pixels 30 may not include color filter elements. Image pixels that do not include color filter elements and image pixels that are provided with clear color filter elements may sometimes be referred to as clear pixels, white pixels, clear image pixels, or white image pixels.

Each pixel 30 may include a photosensitive element such as a photodiode that generates carriers (e.g., electron-hole pairs) in response to impinging photons. A charge transfer gate such as charge transfer gate 36 (e.g., a polysilicon gate structure, a metal gate structure, or other suitable type of conductive gate structure) may be formed in substrate 34. A charge storage node such as charge storage node 38 (e.g., an n-type doped floating diffusion region such as an n+ type doped floating diffusion region) may also be formed in substrate 34. At the end of a charge integration cycle during which charge is accumulated in the photodiode of pixel 30, a charge transfer gate control signal may be momentarily pulsed high so that transfer gate 36 transfers charge from the photodiode to charge storage region 38. Charge readout circuitry may be used to read out a voltage signal associated with the charge stored in region 38.

Pixels 30 may include an anti-blooming drain such as anti-blooming drain 32. Anti-blooming drain 32 may, for example, be an anti-blooming diode that collects overflow charge from the photodiodes of pixels 30 when the photodiodes of pixels 30 are saturated. In the illustrative example of FIG. 2, anti-blooming drain 32 is shared by four pixels 30 (e.g., a red pixel, a blue pixel, and two green pixels, or any other suitable combination of pixels). Each of the four pixels 30 in FIG. 2 may have a photodiode that is directly coupled to anti-blooming drain 32.

This is however, merely illustrative. If desired, there may be one anti-blooming drain 32 for each pixel 30 or there may be one anti-blooming drain 32 for every two or more pixels 30. In general, anti-blooming drain 32 may have any suitable location the pixel array and may have any suitable shape (e.g., anti-blooming drain 32 may be a rectangular shaped region, a diamond shaped region, or any other suitably shaped region).

Figure 3:
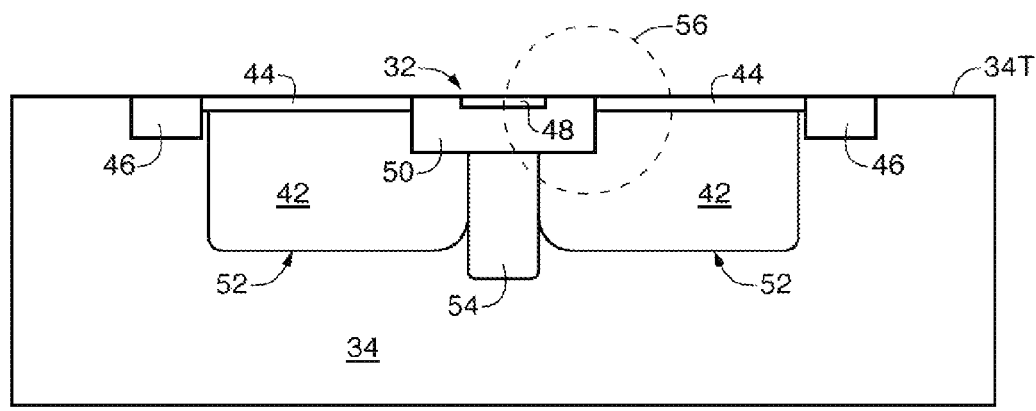
FIG. 3 is a cross-sectional side view showing a cross-section of the image pixels and anti-blooming diode of FIG. 2 in accordance with an embodiment of the present invention.

FIG. 3 shows cross-section of substrate 34 taken along line 40. As shown in FIG. 3, photodiodes such as photodiodes 52 may be formed in upper surface 34T of substrate 34. Photodiodes 52 may, for example, be formed from p-type doped potential pinning layer 44 (e.g., a p+ type doped potential pinning layer) and n-type doped layer 42 at surface 34T of substrate 34. Pixels 30 may be isolated from one another by trench isolation regions such as shallow trench isolation regions 46. A p-type doped region such as p-type well 54 may be interposed between photodiodes 52.

Anti-blooming drain 32 may be interposed between and directly coupled to photodiodes 52. Anti-blooming drain 32 may be an anti-blooming diode formed from an n-type doped laser such as n+ diffusion region 48. N+ type diffusion region 48 may be partially surrounded by a p-type doped region such as p-type doped region 50.

Figure 4:
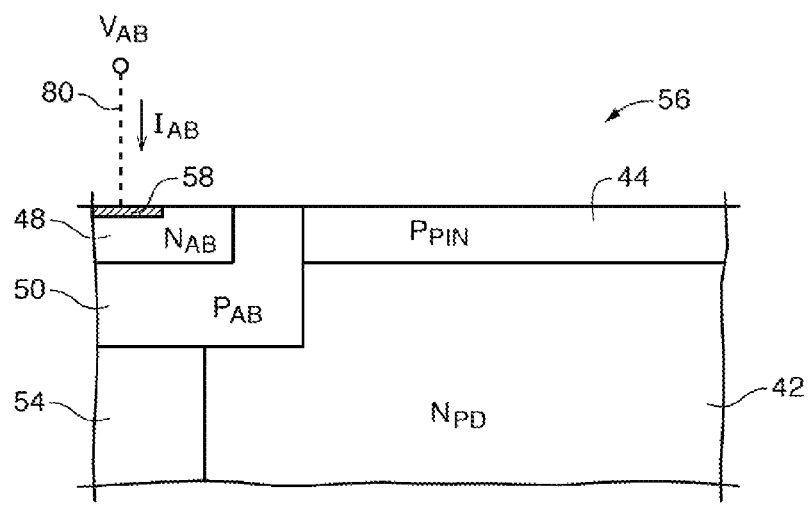
FIG. 4 is a cross-sectional side view showing an enlarged portion of the cross-section of FIG. 3 in accordance with an embodiment of the present invention.

A detailed explanation of how anti-blooming drain 32 operates will be described in connection with FIGS. 4, 5, and 6. FIG. 4 shows an enlarged view of region 56 of FIG. 3. As shown in FIG. 4, multiple p-n junctions are formed in substrate 34. A first p-n junction is formed at the interface between p+ type pinning layer 44 (sometimes referred to herein as $P_{PIN}$ region 44) and n-type doped layer 42 (sometimes referred to herein as $N_{PD}$ region 42). This p-n junction is sometimes referred to herein as a $P_{PIN}$-$N_{PD}$ diode. A second p-n junction is formed at the interface between $N_{PD}$ region 42 and p-type doped region 50 (sometimes referred to herein as $P_{AB}$ region 50). This p-n junction is sometimes referred to herein as a $P_{AB}$-$N_{PD}$ diode. A third p-n junction is formed at the interface between $P_{AB}$ region 50 and n-type doped region 48 (sometimes referred to herein as $N_{AB}$ region 48). This p-n junction is sometimes referred to herein as an $N_{AB}$-$P_{AB}$ diode.

$N_{AB}$ region 48 may be connected to voltage supply line 80 via an electrical contact such as electric contact 58. Voltage supply line 80 may be configured to supply a voltage $V_{AB}$, which may be a positive voltage (e.g., 2.8 Volts or other suitable voltage). The $N_{AB}$-$P_{AB}$-$N_{PD}$ regions are similar to an n-p-n bipolar transistor with the $N_{AB}$, $P_{AB}$, and $N_{PD}$ regions comparable to the collector, base, and emitter regions, respectively.

Figure 5:
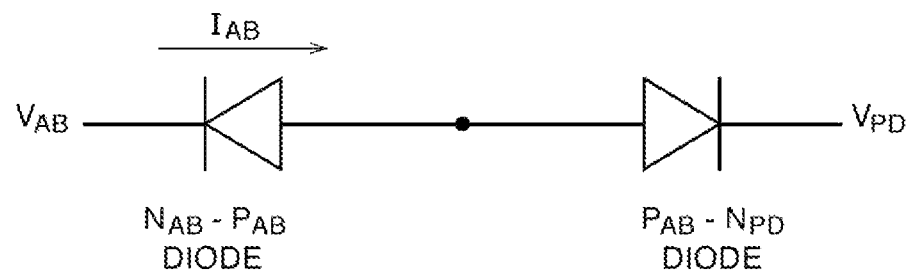
FIG. 5 is a circuit diagram of art illustrative anti-blooming diode that may be coupled to a photodiode in an image pixel in accordance with an embodiment of the present invention.

A circuit diagram illustrating the configuration of the $P_{AB}$-$N_{PD}$ diode and the $N_{AB}$-$P_{AB}$ diode is shown in FIG. 5, where $V_{PD}$ corresponds to the potential in photodiode 52 and $V_{AB}$ corresponds to the positive voltage that is applied to $N_{AB}$ region 48. When photodiode 52 is reset just before the start of an integration period, $V_{PD}$ is approximately equal to the voltage on pinning layer 44 (e.g., a voltage of 1.7-1.8 Volts or other suitable voltage). When photodiode 52 is empty (e.g., when photodiode 52 has not yet begun collecting charge during an integration period), the $P_{AB}$-$N_{PD}$ diode is therefore reversed biased (e.g., only a negligible amount of leakage current flows through the $P_{AB}$-$N_{PD}$ diode). Similarly, because $N_{AB}$ 48 is connected to a positive voltage supply $V_{AB}$, the $N_{AB}$-$P_{AB}$ diode is also reversed biased when photodiode 52 is empty and only a negligible amount of leakage current flows through the $N_{AB}$-$P_{AB}$ diode.

Thus, when photodiode 52 is empty prior to integration, both $N_{PD}$ region 42 and $N_{AB}$ region 48 are positively biased with respect to $P_{AB}$ region 50 and current $I_{AB}$ through the $N_{AB}$-$P_{AB}$ diode is a negligible leakage current. However, when an integration period begins, photodiode 52 begins to collect photo-generated electrons and $V_{PD}$ begins to decrease. After photodiode 52 becomes saturated, $V_{PD}$ drops below zero and eventually $N_{PD}$ region 42 becomes negatively biased with respect to $P_{AB}$ region 48. When $N_{PD}$ region 42 becomes negatively biased with respect to $P_{AB}$ region 48, the $P_{AB}$-$N_{PD}$ diode becomes forward biased and current begins to flow through the $P_{AB}$-$N_{PD}$ diode (e.g., electrons begin to flow from photodiode 52 towards anti-blooming diode 32). The electrons that flow from the $P_{AB}$-$N_{PD}$ diode towards the $N_{AB}$-$P_{AB}$ diode are then swept by the electric field across the $N_{AB}$-$P_{PD}$ depletion region into drain 32 (e.g., towards contact 48 and power supply line 80). The current $I_{AB}$ through the $N_{AB}$-$P_{AB}$ diode increases rapidly as electrons are injected from photodiode 52 when photodiode 52 is saturated.

Figure 6:
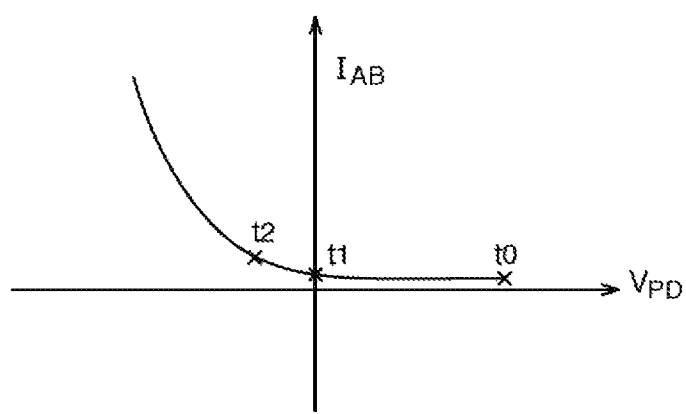
FIG. 6 is a graph illustrating the current-voltage characteristics of an anti-blooming diode that may be located in an image pixel in accordance with an embodiment of the present invention.

A diagram illustrating the current-voltage characteristics of anti-blooming diode 32 is shown in FIG. 6. At the start of integration (time t0), the potential in photodiode 52 ($V_{PD}$) is a positive value (e.g., 1.7-1.8 Volts or other suitable voltage). At this point, both $N_{PD}$ region 42 and $N_{AB}$ region 48 are positively biased with respect to $P_{AB}$ region 50 and current $I_{AB}$ through the $N_{AB}$-$P_{AB}$ diode is a negligible leakage current.

As the integration period begins, $V_{PD}$ begins to decrease as electrons are collected in photodiode 52. At time t1, photodiode 52 is full (saturated). When $V_{PD}$ reaches a given value, at time t2, $N_{PD}$ region 42 becomes negatively biased with respect to $P_{AB}$ region 50 (the $P_{AB}$-$N_{PD}$ diode becomes forward biased), and current $I_{AB}$ begins to flow towards $N_{PD}$ region 42 (i.e., electrons flow from $N_{PD}$ region 42 towards anti-blooming drain 32).

The threshold voltage $V_{PD}$ at which the $P_{AB}$-$N_{PD}$ diode becomes forward biased (sometimes referred to as the crossover voltage, shown at time t2 in FIG. 6) may depend on the design of the $N_{AB}$-$P_{AB}$ diode and the voltage bias on $N_{AB}$. For example, the threshold voltage may correspond to the level of doping in $P_{AB}$ region 50, and the level of doping in $P_{AB}$ region 50 may therefore be chosen to achieve the desired threshold voltage.

Although the illustrative examples described in connection with FIGS. 2-6 correspond to an electron-based image sensor, the concept of an in-pixel anti-blooming drain may also be applied to hole-based image sensors. With this type of configuration, the anti-blooming drain may be a p-type doped region, the base may be an n-type doped region, and the photodiode may include a p-type doped region.

Figure 7:
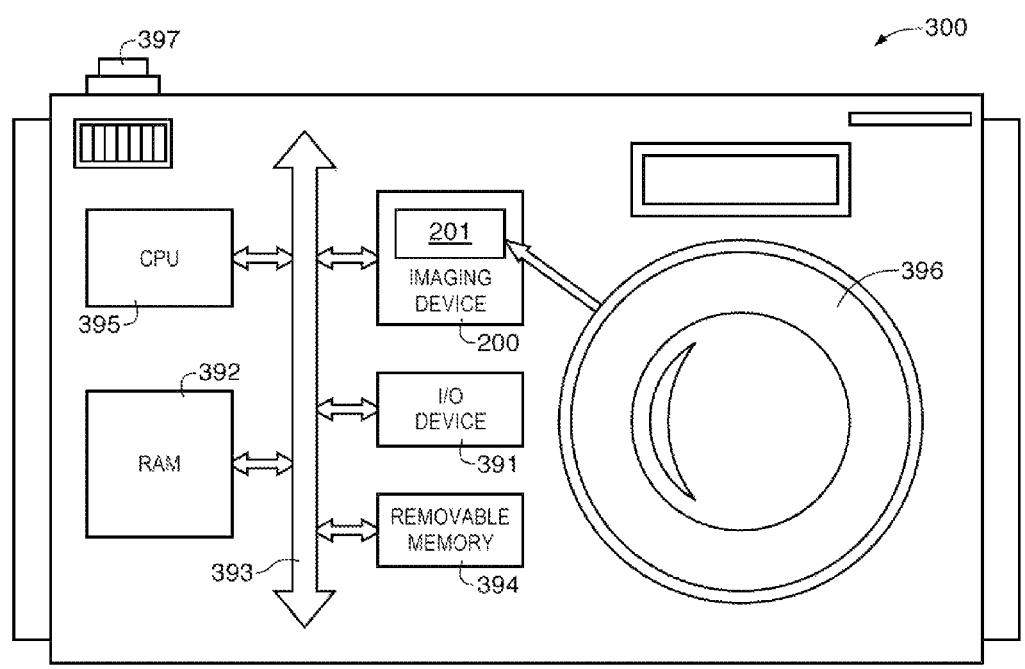
FIG. 7 is a block diagram of a system employing the embodiments of FIGS. 1-6 in accordance with an embodiment of the present invention.

FIG. 7 shows in simplified form a typical processor system 300, such as a digital camera, which includes an imaging device 200. Imaging device 200 may include a pixel array 201 (e.g., an array of image sensor pixels such as image sensor pixels 30 of FIG. 2 having in-pixel anti-blooming drains). Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include as lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating an image sensor such as a backside illuminated image sensor having an array of image sensor pixels. The image sensor pixels may each include a photodiode formed from a p-type doped potential pinning layer stacked on an n-type doped layer at an upper surface of an image sensor substrate. Photodiodes may be isolated from one another by trench isolation regions.

An image sensor pixel may include an in-pixel anti-blooming drain for collecting overflow charge in the pixel when the photodiode is saturated. The anti-blooming drain may be interposed between adjacent photodiodes at the surface of the image sensor substrate. The anti-blooming drain may be an anti-blooming diode formed front an n-type diffusion region that is partially surrounded by a p-type doped region, thereby forming a p-n junction adjacent to the photodiode. The n-type diffusion region of the anti-blooming diode may be connected to a positive voltage supply line.

Thus, a first p-n diode, the $P_{AB}$-$N_{PD}$ diode, is formed at the junction between the n-type doped layer of the photodiode and the and p-type doped region, and a second diode, the $N_{AB}$-$P_{AB}$ diode, is formed at the junction between the p-type doped region and the n-type diffusion layer of the anti-blooming diode.

Just before the start of an integration period, both the n-type doped layer of the photodiode and the n-type diffusion layer of the anti-blooming diode may be positively biased with respect to the p-type doped region (which is interposed between and in contact with the n-type doped layer of the photodiode and the n-type diffusion layer of the anti-blooming diode). When the n-type doped layer of the photodiode and the n-type diffusion layer of the anti-blooming diode are positively biased with respect to the p-type doped region, both the $P_{AB}$-$N_{PD}$ diode and the $N_{AB}$-$P_{AB}$ diode are reversed biased and the only current flowing through the diodes is a negligible leakage current.

When the photodiode begins to collect electrons during the integration period, the potential associated with the photodiode drops. After the pixel becomes saturated, the potential in the n-type doped layer of the photodiode becomes negative with respect to $P_{AB}$ and reaches a threshold voltage at which point the $P_{AB}$-$N_{PD}$ diode becomes forward biased and current starts to flow through it. Overflow electrons from the n-type doped layer of the photodiode are injected into the $N_{AB}$-$P_{AB}$ diode and the current flowing through the $N_{AB}$-$P_{AB}$ diode increases as the excess electrons are drained into the anti-blooming diode.

The in-pixel anti-blooming diode forms an effective anti-blooming structure for collecting overflow charge from saturated pixels. The in-pixel anti-blooming diode helps prevent excess charge from spilling into neighboring pixels without requiring complex circuitry, without decreasing full well capacity, and without contributing to dark current. The in-pixel anti-blooming structure may be advantageous in image sensor configurations where a vertical anti-blooming drain is not a feasible option (e.g., in backside illuminated image sensor configurations).

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel comprising:
   substrate;
   a photodiode formed in the substrate; and
   an anti-blooming diode formed in the substrate that is directly coupled to the photodiode, wherein the anti-blooming diode is configured to begin draining excess charge in response to the photodiode reaching a threshold voltage and wherein the threshold voltage corresponds to a level of doping in the anti-blooming diode.

2. The image sensor pixel defined in claim 1 wherein the anti-blooming diode comprises an n-type diffusion region at least partially surrounded by a p-type doped region.

3. The image sensor pixel defined in claim 1 wherein the anti-blooming diode is configured to drain excess charge from the photodiode when the photodiode is saturated.

4. The image sensor pixel defined in claim 2 wherein the photodiode comprises an n-type doped region and wherein the p-type doped region is interposed between and in contact with the n-type diffusion region and the n-type doped region.

5. The image sensor pixel defined in claim 4 further comprising:
   an electrical contact formed in the substrate in the n-type diffusion region; and
   a voltage supply line connected to the electrical contact.

6. The image sensor pixel defined in claim 5 wherein the substrate comprises a surface, the image sensor pixel further comprising:
a p-type doped potential pinning layer interposed between the n-type doped region and the surface of the substrate, wherein the p-type doped potential pinning layer is in contact with the p-type doped region of the anti-blooming diode.

7. The image sensor pixel defined in claim 5 wherein the voltage supply line comprises a positive voltage supply line.

8. An image sensor having an image pixel array, comprising:
a first image pixel comprising a first photodiode;
a second image pixel comprising a second photodiode; and
an anti-blooming diode interposed between and directly coupled to the first and second photodiodes.

9. The image sensor defined in claim 8 wherein the anti-blooming diode is coupled to a voltage supply line.

10. The image sensor defined in claim 8 wherein the anti-blooming diode is configured to drain excess charge from the first photodiode when the first photodiode is saturated and to drain excess charge from the second photodiode when the second photodiode is saturated.

11. The image sensor defined in claim 8 further comprising third and fourth image pixels having respective third and fourth photodiodes, wherein the anti-blooming diode is interposed between and directly coupled to the third and fourth photodiodes.

12. The image sensor defined in claim 9 wherein the anti-blooming diode comprises an n-type diffusion region at least partially surrounded by a p-type doped region.

13. The image sensor defined in claim 12 wherein the first and second photodiodes comprise respective first and second n-type doped regions and wherein the p-type doped region of the anti-blooming diode is interposed between and in contact with the first and second n-type doped regions.

14. The image sensor defined in claim 13 further comprising a p-well formed under the anti-blooming diode and interposed between the first and second photodiodes.

15. A system, comprising:
a central processing unit;
memory;
input-output circuitry; and
an imaging device, wherein the imaging device comprises:
a pixel array having a plurality of image pixels, wherein each image pixel comprises a photodiode, and wherein each photodiode in the pixel array is directly coupled to an anti-blooming diode.

16. The system defined in claim 15 wherein each anti-blooming diode is coupled to a positive voltage supply line.

17. The system defined in claim 15 wherein the photodiodes and the anti-blooming diodes are formed in a substrate having an upper surface, wherein the photodiodes extend to a first depth in the substrate relative to the upper surface, and wherein the anti-blooming diodes extend to a second depth in the substrate relative to the upper surface, and wherein the first depth is greater than the second depth.

18. The system defined in claim 16 wherein each anti-blooming diode comprises an n-type diffusion region surrounded by a p-type doped region.

19. The system defined in claim 18 wherein each photodiode comprises an n-type doped region, wherein the n-type doped region is in contact with the p-type doped region of an associated one of the anti-blooming diodes.

\* \* \* \* \*